MOLDED SANDWICH ELECTRICAL CONNECTOR WITH IMPROVED CONNECTOR PINS AND ENCAPSULATING STRUCTURE

Filed Dec. 13, 1965

INVENTORS
ALBERT E. PAUL
CHARLES W. SMITH
BY
Roger A. Marrs

United States Patent Office 3,353,070

Patented Nov. 14, 1967

3,353,070

MOLDED SANDWICH ELECTRICAL CONNECTOR WITH IMPROVED CONNECTOR PINS AND ENCAPSULATING STRUCTURE

Albert E. Paul, Thousand Oaks, and Charles W. Smith, Canoga Park, Calif., assignors to The Bunker-Ramo Corporation, Stamford, Conn., a corporation of Delaware Filed Dec. 13, 1965, Ser. No. 513,177

11 Claims. (Cl. 317—101)

ABSTRACT OF THE DISCLOSURE

A molded sandwich electrical connector is disclosed herein for interconnecting a plurality of electrical circuits including a flexible layer of plastic material having a plurality of electrically conductive strips embedded therein and including a plurality of connector pins arranged across selected ones of the conductive strips which are secured to selected ones of the strips so as to provide electrical and mechanical continuity therewith. Selected ones of the connector pins are provided with an attachment portion which projects beyond the edge of the plastic layer. A body of relatively rigid electrically insulative material is employed to encapsulate the flexible layer and the connector pins so as to form a rigid connector except for the attachment portions.

This invention relates to improved means for interconnecting electronic circuits and more particularly to a novel molded sandwich electrical connector which may be readily employed for interconnecting electronic circuitry on a printed circuit board as well as for providing a safety fuse device for protecting the interconnected circuits against overload conditions.

As the usefulness of computers has expanded from strictly computational and accounting types of problems to problems of simulating control and others, and with the widening demand, both militarily and commercially, for computers capable of handling vast quantities of information at increased rates of speed, the need for high density electronic packaging has become of increasing importance. A concomitant of this trend is the need for circuit protection which, while providing the requisite component density, maintains both system reliability and serviceability. Under the thrust of this expanding use, it has become an economic necessity to provide circuit interconnecting means for electronic equipment which both minimizes the possibility of error in field maintenance procedures and reduces over-all system complexity.

With increase in component density, the reliability of circuit interconnecting means has become a paramount significance. Particularly, this is true with regard to the design, construction, and interconnection of circuit components and assemblages which carry out the basic work function of the data processing system. Conventionally, the electrical circuit network generally comprises a plurality of logic circuits such as "gates" and "flip-flops" interconnected to form an electronic complex designed to carry out the various arithmetical and logical functions for which the equipment is programmed.

These basic circuits lend themselves to compact arrangement on printed circuit boards or cards whereon conductive sockets may be arranged along one end of the board or card which are used for external connections thereto permit interconnection of the circuitry carried on the board. Generally, a connector is employed for providing a means for interconnecting the circuitry. The connecting means may incorporate plug wires to make the interconnection not only between the circuitry contained on the circuit board, but between additional printed circuit boards or cards.

Conventionally, one form of pluggable interconnecting circuit connector has been provided which includes a rigid, electrically non-conductive strip, copper clad on one side, which is etched or milled to form selected land patterns in the copper cladding, and holes formed through the rigid strip and in those land areas in the pattern to which electrical contact is to be made. The holes serve as receptacles into which a bent portion of a connector pin is inserted while the attachment or plug portion of the connector is laid transversely across the remaining land areas of the pattern to project outwardly from the connector. A separate layer of electrically insulative material is disposed between the connector pin and the land areas over which the connector attachment portion crosses so that electrical continuity is established only with the land area having contact with the bent portion of the connector pin. Generally, additional copper clad insulative strips having land areas etched thereon and additional connector pins may be employed in a type of sandwich construction.

The land areas are designed to form a part of the electronic circuitry carried on the circuit board so that once the connector has been plugged into the board via the plug portions of the connector, selected circuits on the board are interconnected via the land areas. These areas may take the form of buttons, but generally the land areas form a pattern of conductive strips of varying length. Since the etched or milled land areas form strips, each strip has electrical characteristics which not only permit the conductive strip to serve as an interconnector between circuits but permit the strip to serve as a fuse device for protecting the electronic circuitry from damage due to voltage overload conditions.

However, difficulties and problems have been encountered when employing a sandwich type electronic circuit interconnecting means as described above which stem largely from the fact that the cost of manufacture is relatively high due to the many forming and assembly procedures required. Furthermore, the bent pin connections with the land areas having holes provided in the rigid strip present certain vibration problems which are difficult to overcome. Therefore, higher reliability is difficult to achieve. The electrical characteristics of the land areas of the pattern formed in the copper cladding are affected due to the etching or milling procedure causing adverse thermal stability conditions. Furthermore, the spacing between adjacent land areas, particularly when taking the form of strips, may be difficult to control due to minute irregularities present in the edges or sides of the land areas formed by the etching or milling procedures. These irregularities cause the land areas to be variable in width, particularly along a length of land area which serves as a conductor, so that the conductor width is not constant, which changes the capacitance and resistance values of the land areas and adversely affects the conductor's function as a safety fuse device. This problem is particularly acute in the conventional conductor described above since the land areas are laterally separated from one another by an electrically insulative, adhesive material which may contain air voids in turn making it difficult to maintain a constant value of capacitance.

The difficulties and problems encountered with conventional electrical connectors for interconnecting a plurality of electrical circuits carried on a printed circuit board are obviated by the present invention, which provides a band or layer of flexible plastic tape or sheeting having a plurality of preformed electrically conductive material areas embedded therein in the form of continuous strips arranged in parallel so that the plastic material completely surrounds the conductive material.

Each conductive strip may be interrupted throughout its length by punching or otherwise removing a portion or portions of the conductive strip so as to provide a plurality of short conductive strips lying in an in-line relationship. The length of these short strips is determined by the distance between terminal sockets carried by the circuit board depending upon the circuit requirement of the electronic circuits to be interconnected. In some instances, such as a bus bar, the length of the conductive strips is not interrupted, and it extends from one end of the band or layer to the opposite end thereof. A plurality of connector pins are joined to the conductive strips along one side of the band or layer normal to the longitudinal axis thereof and in fixed parallel spaced relationship with respect to each other. The connector pins are preferably welded to the conductive strip material employing resistance welding techniques so that the plastic insulative material between that portion of the connector pin and the conductive strip intended to be connected therewih is melted or burned away during the welding procedure. Consequently, the manufacturing step of removing the insulation is completely obviated. Each connector pin of the plurality has a plug portion extending beyond the edge of the plastic layer, and the assembled connector pins and plastic layer including the embedded conductive strips are encapsulated whereby only the plug portions of the connector pins extend outwardly from the encapsulated strip layer.

Once the plug portions of the connector pins have been inserted into suitable sockets carried by the printed circuit board, various electronic circuits carried by the board are interconnected via the connector strips between desired connector pins. By employing preformed continuous conductor strips from electrically conductive material, the width of the connector strip can be closely controlled within very close tolerances such that the capacitance and resistance values of the strips can be maintained within predetermined limits. Therefore, the conductive strips may be employed for safety fuse purposes so that the strip will burn out or cause a break therein to interrupt the continuity in any electrical circuit so as to protect the circuit from overload conditions.

The electrical conductor of the present invention may include multiple layers of plastic material having preformed electrical conductive material embedded therein to form conductive strips so that a sandwich electrical connector can be assembled which will accommodate the interconnection between a plurality of electronic circuits. Also, inasmuch as the layer of plastic material completely surrounds the conductive strips, separate layers or sheets of insulative material need not be stocked or handled in the assembly operation, as is done in the conventional manner.

The features of the present invention which are believed to be novel are set forth with particularity in the appended claims. The present invention, both as to its organization and manner of operation, together with further objects and advantages thereof, may best be understood by reference to the following description, taken in connection with the accompanying drawing, in which:

Figure 1:
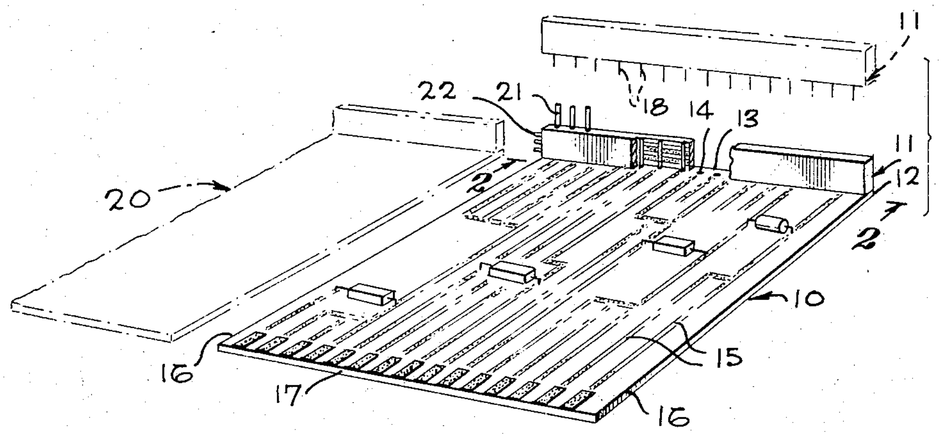
FIGURE 1 is a perspective view of a printed circuit board showing the molded sandwich electrical connector of the present invention mounted on one end thereof.
Figure 2:
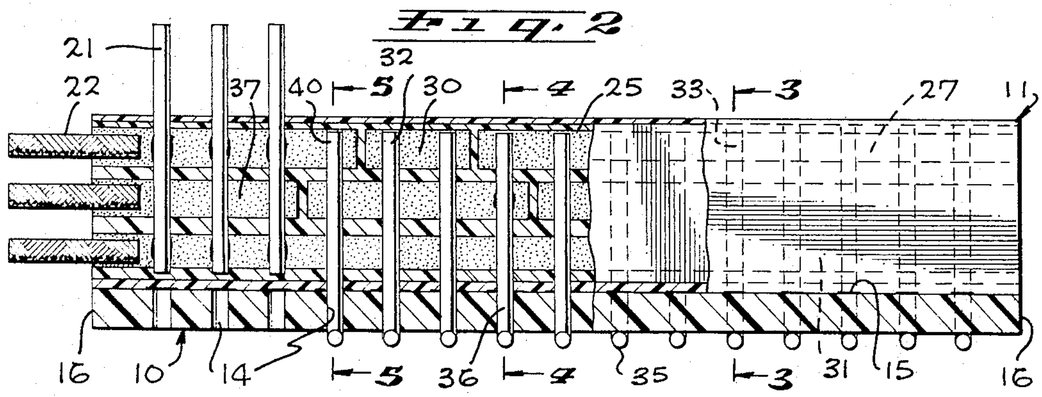
FIG. 2 is a front elevational view of the connector mounted on the printed circuit board of FIG. 1 as taken in the direction of arrows 2—2 and partially broken away to illustrate the sandwich layer construction thereof.

Referring to FIG. 1, an etched or printed circuit panel or board 10 is illustrated, into which an electrical connector 11 in accordance with the present invention is inserted. The board 10 in this example is substantially rectangular, having a lineal edge 12. Mounted on an edge marginal region 13 and contiguous to the lineal edge 12 are a plurality of electrical contact sockets 14 which may be suitably secured on the board 10 and which communicate with other circuitry on the board via formed electrical contact areas 15 which interconnect other circuit networks and electronic components mounted on the face of the board 10 in a typical fashion, as illustrated. The board 10 has a pair of sides 16 which are substantially orthogonal to the edge 12 and a linear edge 17 which is parallel to the edge 12.

The connector 11, as shown in solid lines, is partially broken away to more clearly illustrate the electrical sockets 14 into which a plurality of connector plug portions, such as connector plug portion 18, are inserted. The connector is illustrated in broken lines to show the position of the connector 11 preparatory to insertion into the sockets 14 to provide electrical continuity between the electronic circuits formed in the electrical network carried on the board 10.

Also illustrated in broken lines in FIG. 1 is an additional circuit board 20 disposed adjacent board 10, which may be suitably interconnected with the circuits carried on the board 10 via solid conductors 21 projecting from the end of connector 11 or interconnected by braided wire 22 as desired.

With respect to FIGS. 2 to 5, an enlarged view of the electrical connector of the present invention is shown for interconnecting the plurality of electrical circuits carried on the printed circuit board 10. The electrical connector includes a pair of bands or layers of flexible plastic tape or sheeting 25 and 26, wherein each band or layer includes a plurality of preformed electrically conductive areas embedded therein in the form of continuous strips, such as conductive strip 27. The conductive strips are preferably fabricated of copper and are initially preformed in length and width to very close dimensional tolerances. The thickness of the copper strip may be approximately .008 inch, for example, and the width may be about .040 inch, plus or minus .002 inch. The arrangement of the conductive strips is such that the spacing between adjacent lengths of conductive strip is closely controlled and is insulated by means of a plastic material constituting the thickness of the band or layer. In other words, the insulating bands 25 and 26 may each enclose a plurality of conductors 30 forming a predetermined land pattern wherein both sides of the conductors as well as the areas therebetween are laminated between layers of plastic insulation. Preferably, Mylar plastic is employed, and each band or layer may have a thickness of .014 inch wherein the plastic insulation present on the opposite sides of the conductors may be in the order of at least .002 inch thick. Consequently, predetermined values of both capacitance and resistance can be established so that the conductive strips may readily serve as fusing devices which may be melted or broken to interrupt circuit continuity in the event of circuit current overload. The layers 25 and 26 may be readily obtained commercially from the Tape Cable Corporation, Rochester, N.Y., under the trade name Tape Cable.

The conductive strips carried by the bands 25 and 26 may be suitably interrupted throughout their length by punching or otherwise removing a portion or portions of the conductive strip so as to provide a plurality of short conductive strips lying in an in-line relationship such as is represented by the conductive strip segment 30. The length of these short strips is determined by the distance between terminal sockets 14 carried by the circuit board depending upon the circuit requirements of the electronic circuit to be interconnected. However, in some instances, such as when the conductive strip is to be employed as a bus bar as is indicated by numeral 31, the length of the conductive strip is not interrupted and the conductive strip extends from one end of the band or layer to the opposite end thereof.

It is to be particularly noted that the continuous strips of conductive material form a predetermined land pattern wherein the plurality of conductive strips are arranged in parallel spaced apart relationship so that the plastic material completely surrounds the conductive material. As shown more clearly in the enlarged view of FIG. 3, plastic not only insulatively cover the top side and bottom side of the conductive strips, but completely fills the area between adjacent land areas of conductive stripping. Such an arrangement has great benefit in effecting thermal stability of the connector and therefore greatly enhances the reliability and operability of the connector for its intended purposes.

Figure 3:
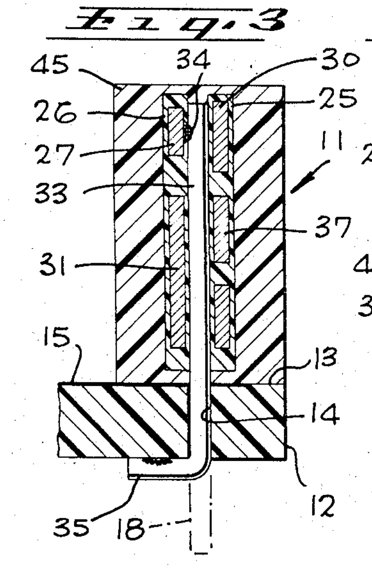
FIG. 3 is a cross-sectional view of the electrical connector taken in the direction of arrows 3—3 of FIG. 2.

A plurality of connector pins, such as indicated by numeral 32, are joined to the conductive strips along one side of the band or layer transverse to the longitudinal axis thereof and in fixed parallel spaced relationship with respect to each other. The connector pins are of equal length and are preferably welded to the conductive strip employing resistance welding techniques so that the plastic insulative material between that portion of the connector pin and the conductive strip intended to be connected therewith is melted or burned away during the welding procedure. As shown in FIG. 3, a conductor pin 33 is secured at weld 34 to the conductive strip 27. The weld per se and removal of insulating material at the point of weld are achieved simultaneously by the employment of the resistance welding technique. However, the plastic material of the band 26 covering the embedded connector strips is interposed between the conductive strips and the pin 33 except at the point of weld. The insulative material of the band 25 also electrically isolates the connector pin 33 from the conductive strip embedded therein.

Each connector pin of the plurality has a plug portion 18 which extends beyond the edge of the plastic band or layer which may be inserted into the socket or receptacle 14 carried by the circuit board 10. Once inserted, the plug portion 35 may be bent over against the underside of the circuit board to achieve retention of the connector 11 onto the board. To assure electrical connection, the bent portion 35 may be soldered in situ in the receptacle or socket 14.

The connector pins 21 are shown projecting from the side of the connector 11 opposite to the side from which the pluggable portions 18 extend, and these pins may be employed for coupling into other circuit boards or apparatus associated with the circuitry carried on the board 10. Inasmuch as these connector pins are of solid material, resistance welding techniques may also be employed to secure the connector pins 21 to desired conductive strips in either layer 26 or 25; however, in the event braided wire is employed, such as represented by wire 22, the insulation adjacent the point of contact with a particular conductive strip must first be removed as by cutting or grinding so that the braided wire may be attached to the conductive strip by conventional methods, such as soldering, for example.

To complete the assembly of the sandwich electrical connector of the present invention, the assembled layers 25 and 26 including the welded connector pins 32 may be encapsulated and thereby hermetically sealed with a plastic material 45 such as epoxy by means of transfer, injection, compression or pour molding. When finally encapsulated, the pluggable portions 18 of the connecting pins as well as the extending portions of pins 21 and braided wires 22 are exposed from the encapsulating material and are free for external connection with other circuits.

Figure 4:
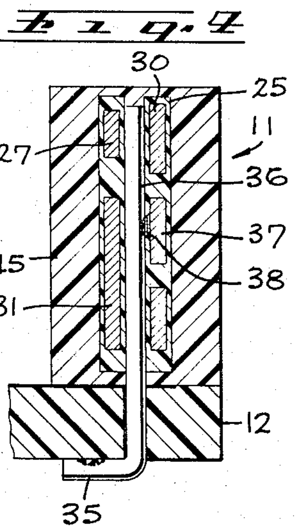
FIG. 4 is a cross-sectional view of the electrical connector taken in the direction of arrows 4—4 of FIG. 2.
Figure 5:
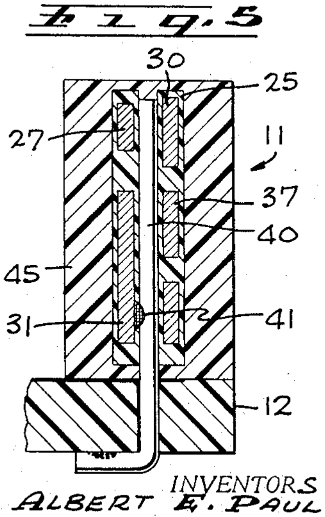
FIG. 5 is a cross-sectional view of the electrical connector shown in FIG. 2 as taken in the direction of arrows 5—5 thereof.

A feature of the present invention resides in the fact that the pin connectors 32 may be manufactured the same length regardless of the circuit connection to be made with particular conductive strips. Therefore, only one length of connector pin need be stocked for assembly purposes. Since the connection of the connector pin 32 to particular land areas in the pattern of conductive strips resides at the point of welding, the length of the connector pin has no bearing on the connection point with the conductive strip. For example, a conductor pin 36 is shown in FIG. 4 which is welded to a conductive strip 37 by weld 38, and, as shown in FIG. 5, a conductor pin 40 is welded to the conductor strip 31 by weld 41. As in the instance previously described with respect to connector pin 33, the connector pins 36 and 40 are electrically insulated from all of the conductive strips embedded in the layers 25 and 26 other than at points 38 and 41.

In the embodiment illustrated in FIGS. 2–5 inclusive, the conductive strips 27 and 37, for example, are employed as conductors for interconnecting various connector pins which are attached to the conductive strips. However, the conductive strip 31 is employed as a bus bar or strip to which a plurality of connector pins may be selectively secured along its length, and the bus strip does not include any breaks or interruptions throughout its entire length, which extends from one end of the conductor 11 to its opposite end. It is to be understood that whether the conductive strips are employed for circuit interconnecting purposes or for purposes of a bus bar or line, the conductive areas may serve as an expendable device for opening an electric circuit when the current passing through the circuit becomes excessive. In essence, the conductive areas become a fusing device which consists principally of a section or segment of conductor strip which may be referred to as a fusible element, of such properties and proportions that excessive current will melt it and thereby sever the circuit. Fuse elements such as contemplated by the present invention are employed to protect circuit conductors and circuit components from damage which would result from sustained excessive current carried thereby. For fuse purposes, the conductive strips may be rated according to the voltage of the circuit for which they are designed, the current they can carry continuously, and the amount of excessive current they can successively interrupt. For fuse purposes, the plastic insulation surrounding the fusible element which takes the form of the conductive strips serves to quench the arc that forms when the fusible element melts. Such a provision greatly enhances the ability of the device of the present invention to achieve thermal stability not only when the fusible elements melts, but during the operation of the electronic circuitry interconnected by the conductive strips.

The interruption time required for excessive current to melt the fusible element varies inversely as the value of the current increases. However, the nature of this variation, namely the shape of the time-current curve, depends to a marked degree upon the size, shape and material of the fusible material of the conductive strip. The time required to quench the arc after melting depends upon the nature of the arc quenching material as well as the fusible element material. The sum of the melting and arcing time is known in the art as the interrupting time.

Therefore, it can be seen from the foregoing description that a novel molded sandwich type electrical connector is provided which not only serves to interconnect various circuit elements forming an electrical network but which serves as fusing elements for interrupting or severing circuit continuity to potect the circuit conductors and components from damage which would result from sustained excessive current. The manufacturing steps involved in the production of a connector of the present invention are relatively few as compared to prior art connectors of this type, and the cost of manufacture, as well as the cost of component material and parts, is greatly reduced.

While particular embodiments of the present invention have been shown and described, it will be obvious to those skilled in the art that changes and modifications may be made without departing from this invention in its broader aspects, and therefore the aim in the appended claims is to cover all such changes and modifications as fall within the true spirit and scope of this invention.

The embodiments of the invention in which an exclusive property or privilege is claimed are defined as follows:

1. A molded sandwich electrical connector for interconnecting a plurality of electrical circuits, comprising:
a flexible layer of plastic material having a plurality of preformed electrically conductive areas embedded therein to form a pattern of land areas so that said plastic material completely surrounds said conductive land areas;
connector pins disposed across selected ones of said conductive areas along one side of said layer substantially normal to the longitudinal axis thereof and in substantially fixed spaced parallel relationship to each other and being secured to selected ones of said conductive material land areas, selected ones of said connector pins each having a plug portion that projects beyond the edge of said plastic layer; and
a body of relatively rigid electrically insulative material encapsulating said plastic layer including said connector pins except for the plug portions thereof to form a rigid body from which said plug portions outwardly extend.

2. The invention as defined in claim 1 wherein said plastic material incorporated into said layer is disposed between said connector pins and said land areas so as to electrically insulate said connector pins therefrom except at those predetermined points of connector pin securement to selected ones of said conductive land areas.

3. A molded sandwich electrical connector for interconnecting a plurality of electrical circuits, comprising:
a relatively thin flexible striplike body of electricaly insulative material having a plurality of spaced apart strips of electrically conductive material embedded therein and interposed between two outer surfaces of said body and running longitudinally along the length of said body;
a plurality of spaced apart elongated electrically conductive members substantially parallel to one another disposed upon one of said two outer surfaces across said conductive strips and longitudinally extending in a direction transverse to the longitudinal direction of said body, with at least each of two pairs of said members being bonded through said surface in electrically conducting relationship to a respectively different one of said strips; and
a body of relatively rigid electrically insulative material encapsulating both said flexible striplike body and all but a portion of selected ones of said conductive members so as to form a rigid connector affording external electrical access to each of said conductive members and to which external electrical circuitry may be interconnected by electrically coupling different sections thereof to respectively different ones of said selected conductive members.

4. A molded sandwich electrical connector for interconnecting a plurality of electrical circuits, comprising:
a layer of plastic material having a plurality of preformed electrically conductive areas embedded therein to form a pattern of land areas so that said plastic material completely surrounds said conductive land areas, each of said conductive land areas being preformed as to thickness, width, and material properties so as to serve as fusible elements having a specified limited current carrying capacity whereby, in the event of excessive circuit current conditions, a portion of said land areas is melted away to form a break in circuit continuity;

connector pins disposed along one side of said layer substantially normal to the longitudinal axis thereof and in substantially fixed spaced parallel relationship to each other and being secured to selected ones of said conductive material land areas, said connector pins each having a plug portion that projects beyond the edge of said plastic layer; and
a body of relatively rigid electrically insulative material encapsulating said plastic layer including said connector pins except for the plug portions thereof to form a rigid body from which said plug portions outwardly extend.

5. A molded sandwich electrical connector for interconnecting a plurality of electrical circuits, comprising:
a first layer of plastic material having a plurality of preformed electrically conductive areas embedded therein to form a pattern of land areas so that said plastic material will completely surround said conductive land areas;
conductive pins disposed along one side of said layer substantially normal to the longitudinal axis thereof and in substantially fixed spaced parallel relationship to each other and being secured to selected ones of said conductive material land areas, said conductor pins each having a plug portion that projects beyond the edge of said plastic layer;
a second layer of plastic material having a plurality of preformed electrically conductive areas embedded therein to form a pattern of land areas different from said land area pattern carried by said first layer, said connector pins being secured to selected ones of said conductive material land areas carried by both said first and said second layers so that said conductor pins are sandwiched between both of said layers; and
a body of relatively rigid electrically insulative material encapsulating said plastic layer including said connector pins except for the plug portions thereof to form a rigid body from which said plug portions outwardly extend.

6. The invention as defined in claim 5, wherein said connector pins are each composed of a straight length of solid material having substantially the same cross section and being of the same dimensional length.

7. A molded sandwich electrical connector for interconnecting a plurality of electrical circuits, comprising:
a layer of plastic material having a plurality of preformed electrically conductive areas embedded therein to form a pattern of land areas so that said plastic material completely surrounds said conductive land areas, said plastic material incorporated into said layer being disposed between said connector pins and said land areas so as to electrically insulate said connector pins therefrom except at those predetermined points of pin connector securement to selected ones of said conductive land areas;
connector pins disposed along one side of said layer substantially normal to the longitudinal axis thereof and in substantially fixed spaced parallel relationship to each other and being secured to selected ones of said conductive material land areas, said connector pins each having a plug portion that projects beyond the edge of said plastic layer and said connector pins being weldably secured to said selected ones of said conductive material land areas in such a manner that a portion of said plastic material is melted away to expose said land areas at which said pins are welded; and
a body of relatively rigid electrically insulative material encapsulating said plastic layer including said connector pins except for the plug portions thereof to form a rigid body from which said plug portions outwardly extend.

8. The invention as defined in claim 7, wherein said connector pin plug portions are insertably received into a plurality of corresponding sockets carried on the circuit board, said plug portions being bendable over said sockets to mount the electrical connector on the printed circuit board.

9. The invention as defined in claim 8, including braided wire leads disposed between said layers and being secured to selected ones of said conductive material land areas carried by both of said layers, wherein said wire leads are soldered to the respective ones of said land areas.

10. The invention as defined in claim 9, wherein certain ones of said connector pins are secured to the printed circuit board via said sockets and others project outwardly from the electrical connector and are adaptable to interconnect with other external circuitry or additional circuit boards.

11. The invention as defined in claim 10, wherein said encapsulation includes said second layer so that both of said layers are hermetically sealed.

References Cited

UNITED STATES PATENTS

| | | | |
|---|---|---|---|
| 3,021,498 | 2/1962 | Spillar | 339—18 |
| 3,070,650 | 12/1962 | Stearns | 174—88 |
| 3,083,261 | 3/1963 | Francis et al. | 174—88 |

ROBERT S. MACON, *Primary Examiner.*

ROBERT K. SCHAEFER, *Examiner.*

J. R. SCOTT, *Assistant Examiner.*